United States Patent [19]
Collet et al.

[11] Patent Number: 4,741,986
[45] Date of Patent: May 3, 1988

[54] HIGH-RESOLUTION PHOTOSENSITIVE COMPOSITION WHICH CAN BE DEVELOPED BY PLASMA AND A PHOTOLITHOGRAPHIC METHOD OF USING SAID COMPOSITION

[75] Inventors: André Collet, Montpellier; Serge Gourrier, Lognes; Olivier Maurin, Montpellier, all of France

[73] Assignee: U.S. Philips Corp., New York, N.Y.

[21] Appl. No.: 874,744

[22] Filed: Jun. 16, 1986

[30] Foreign Application Priority Data

Jun. 18, 1985 [FR] France ................. 85 09219

[51] Int. Cl.$^4$ .................... G03C 1/71; G03C 1/70; G03C 1/68
[52] U.S. Cl. .................................................. 430/197
[58] Field of Search ........................................ 430/197

[56] References Cited

U.S. PATENT DOCUMENTS

| | | | |
|---|---|---|---|
| 4,197,133 | 4/1980 | Zweifel et al. | 430/195 |
| 4,205,153 | 5/1980 | Weinstein | 526/292 |
| 4,284,707 | 8/1981 | Nagasawa et al. | 430/197 |
| 4,468,447 | 8/1984 | Kanai | 430/197 |

*Primary Examiner*—Paul R. Michl
*Assistant Examiner*—Terri Stevenson
*Attorney, Agent, or Firm*—Norman N. Spain

[57] ABSTRACT

A high-resolution photosensitive composition which can be plasma-developed, including an acrylic polymer and a photosensitive compound, of the aromatic azide group, in which the polymer contains, in a side chain, at least one aromatic nucleus where at least one chlorine atom (Cl) has replaced at least one hydrogen atom (H) for example

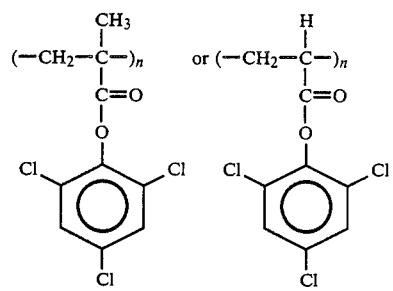

5 Claims, No Drawings

HIGH-RESOLUTION PHOTOSENSITIVE COMPOSITION WHICH CAN BE DEVELOPED BY PLASMA AND A PHOTOLITHOGRAPHIC METHOD OF USING SAID COMPOSITION

BACKGROUND OF THE INVENTION

The invention concerns a composition for a high-resolution photosensitive composition which can be developed by plasma, comprising a polymer and a photosensitive compounds, where the polymer is an acrylate and the photosensitive compound is an aromatic azide.

The invention is useful in the plasma-production of designs smaller than a micron in size with a photosensitive coating after the local irradiation of the photosensitive composition by electromagnetic radiation or a particle beam in order to form masks used at various stages in the manufacture of high-density integrated micro-circuits.

The invention also concerns the method of obtaining the photosensitive composition and the photolithographic process making use of it.

A photosensitive composition like the one described in the preamble is known from U.S. Pat. No. 4,401,745. This document describes a family of resins formed of a polymer and a photosensitive compound in which the polymer is an acrylic or vinyl ketone polymer with molecular weights of between $10^4$ and $2 \times 10^6$ and where the photosensitive compound an aromatic azide. This patent also mentions the possibility of adding a third constituent in the form of a vinyl compound.

The photosensitive compositions described in the cited patent are of the negative type, i.e. the developing agent preferentially acts upon the non-irradiated parts.

These resins are used in the following manner:

After deposition on a substrate, the photosensitive compositions selected from the aforementioned group is locally irradiated in a predetermined pattern using ultra-violet or X-rays or an electron beam. it is then dry-developed using a plasma including oxygen, $CF_4$, a mixture of the two or an oxygen-argon mixture. These plasmas preferentially act upon the non-irradiated parts, and local apertures are formed in the resin coating. The masks thus constituted are used in photolithography in the processes of making integrated circuits.

Nowadays, the size of microcircuit components is of the order of a micrometer ($\mu m$) or even smaller. Therefore, the patterns formed in the resins used in photolithography must be of the same order of magnitude. The qualities of the photosensitive compositions must thus be the best possible, especially with regard to resolution, sensitivity and selectivity.

By resolution is meant the minimum size of the patterns to be defined using the resin; by sensitivity, the minimum radiation dose needed to obtain a chemical change in the resin sufficient for development; and by selectivity, the difference between the rates at which the irradiated and non-irradiated areas are affected.

Photolithographic processes including the use of dry-developing compositions, i.e, by plasma, like the known from the cited document, have many advantages over those in which the compositions are wet-developed, i.e. in a developer bath. In particular, they make it possible to treat numerous samples with better reproducibility. Moreover, they facilitate the integration of the resin development stage in a complete cycle for the manufacture of microcircuit components in vacuo. In addition, it is possible to produce the best possible contrast by improving the anisotropy of engraving by judicious control of the plasma parameters. Finally, they make it possible to take advantage of good sensitivity, an inherent property of negative photosensitive compositions, without limiting the resolution, which happens when negative photosensitive compositions resins are wet-developed, where the loss of resolution is caused by a "swelling" phenomenon ascribable to the developer.

SUMMARY OF THE INVENTION

In order to meet industry's needs for ever higher-grade integrated circuits with an increasingly heavy integration density, this invention proposes a photosensitive resin with the aforementioned qualities and in which the resolution and sensitivity are improved over those of the resin known from the cited document.

This object is achieved according to the invention by means of a composition as described in the preamble, in which the polymer is an acrylate which also contains, in a side chain, at least one aromatic nucleus on which at least one atom of chlorine (Cl) replaces at least one atom of hydrogen (H).

This type of polymer then has a number of advantages. First of all, the reaction rate in an oxygen plasma is greater than that of the previously known polymers, thus improving selectivity.

However, these polymers exhibit a good resistance to the action of other plasmas like $CF_4$ or $CF_4+O_2$, which are the ones used on substrates in the manufacture of microcircuits. This property makes it possible to consider selective engraving between the resin and the substrates.

Finally, the presence of chlorine atoms in the polymer structure gives a high absorption of certain X-ray wavelengths, thus improving sensitivity to this type of radiation.

DETAILED DESCRIPTION OF THE INVENTION

By way of non-limitative example of such a polymer may be mentioned poly(2,4,6-trichlorophenylmethacrylate) (PT C Ph MA) with the formula (1)

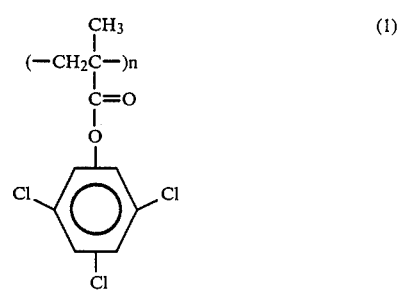

or poly(2,4,6-trichlorophenylacrylate) (PT C Ph A) with the formula (2)

(2)

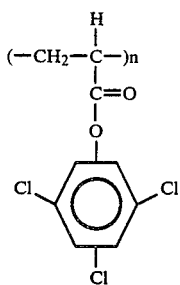

and their copolymers with methyl methacrylate and methyl acrylate.

The photosensitive composition of the invention composition also includes a photosensitive compound of the aromatic azide type, the general formulae are given in (3, 4, 5, 6, 7, 8, 9, 10 and 11)

(3)
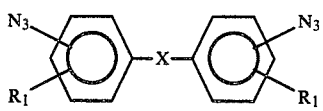

(4)
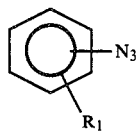

(5)
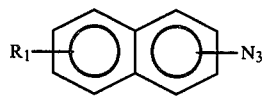

(6)
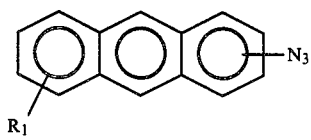

(7)
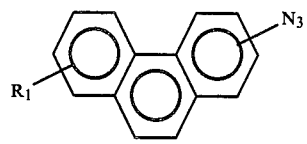

(8)
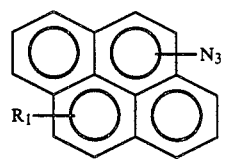

(9)
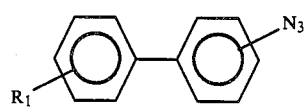

-continued

(10)
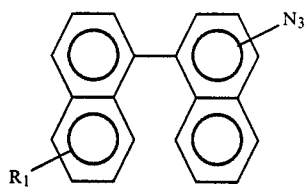

(11)
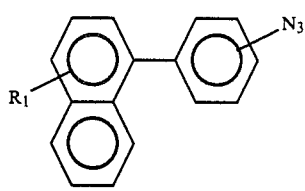

in which, by way of non-limitative examples, X represents —O—, —NH—, —CO, $CH_2$—, —S—, —$SO_2$—, —CH=CH—, —CH=CH—CO—CH=CH—, —CH=CH—CO—, or (12², 13)

(12)
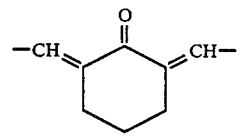

or

(13)
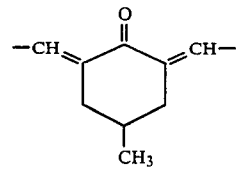

in which $R_1$ represents: a hydrogen atom, a halogen atom, an azide group, an alkali group or an alkyl halogen group.

Particular examples are: 1-amino-5-azidonaphthalene, 4,4'-diazodiphenyl sulphone, or 2-6-di(4'-azidobenzylidene)-4-methyl cyclohexanone.

In a photolithographic process making use of the photosensitive composition thus constituted, the composition dissolved in a suitable solvent, is deposited on a semiconductor substrate and then pre-heated to remove the solvent. The resultant coating is then irradiated through a mask. The azides employed in the composition of the invention are photosensitive compounds in the ultra-violet range. Therefore, irradiation of this resin with ultra-violet radiation is especially effective. Nevertheless, the invention is not limited to the use of this type of radiation.

The presence of chlorine in the polymer structure provides an excellent sensitivity to certain X-ray wavelengths. Finally, electron irradiation may also be used in the context of the invention.

Irradiation fixes the photosensitive compound on the polymer, with the formation of secondary aromatic amines with highly anti-oxidant properties.

After irradiation, the sample thus constituted is subject to "post-heating". This stage is essential to remove the azide from the unexposed areas, whereas in the exposed areas the secondary amines remain fixed to the polymer. The post-heating temperature depends upon the azide used.

The sample is now ready for plasma development.

According to the cited prior-art document, the polymer must contain no aromatic nucleus in either the main or a side chain. This stipulation is perfectly well founded, for polymers containing such nuclei would exhibit a low rate of action under oxygen plasma, resulting in poor selectivity.

In the present invention, on the contrary, the polymer includes in a side chain at least one aromatic nucleus in which one (or more) atoms of chlorine replace one (or more) atoms of hydrogen. Here, the rate of action on the polymer in an oxygen plasma becomes very considerable and the selectivity of the resin is significantly improved; all the more so as the irradiated areas, as has been seen, have strong anti-oxidant properties, resulting in a very low rate of action in an oxygen plasma.

Oxygen plasma will therefore preferably be used in applying a photo-lithographic process using the resin of the invention. Moreover, this resin exhibits a noteworthy resistance to action by a $CF_4+O_2$ plasma, giving the advantage of allowing selective action during the photolithographic process. The $CF_4+O_2$ plasma is indeed widely used to engrave semiconductor substrates in certain stages of the manufacture of microcircuits.

The respective proportions in the photosensitive composition of the polymer and the photosensitive compound are determined in view of two parameters:
the compatibility between the polymer, the photosensitive compound and the solvent;
the ability of the photosensitive compound to absorb the radiation used.

EXAMPLE OF THE COMPOSITION AND USE OF THE RESIN

A photosensitive composition of the invention may be made using:
500 mg of polytrichlorophenyl methacrylate (PTC Ph MA) as the polymer, with a molecular weight of $216 \times 10^3$ dissolved in a mixture of 5 cm$^3$ chlorobenzene and 0.6 cm$^3$ of NN-dimethyl acetamide containing
75 mg of diazidophenyl sulphone as the photosensitive compound.

Following solution, a layer of about 150 nm thick is deposited by spinning on a wafer of a semiconductor material used as the substrate for an integrated circuit.

The sample thus prepared is pre-heated at a temperature of 90° C. under nitrogen for 30 min. in order properly to remove the solvent.

The sample is then irradiated in the intended pattern for the microcircuit components to be provided on the substrate. This process may take place using ultra-violet radiation with a wavelength of 310 nm. The radiation doses may lie in the range from 90 to 180 mJ/m$^2$.

Thereafter the sample is post-heated at about 140° C. under nitrogen for about 30 min. As has been stated, the azide is removed from the unexposed areas during this operation.

Finally, the sample is placed in a plasma chamber. In the example described here, the chamber is of the diode type. The electrodes are about 10 cm in diameter and about 3 cm apart.

During the plasma action:
the pressure is about $7 \times 10^{-1}$ Torr:
the oxygen flow rate is about 100 cm$^3$/min;
the power is 100 W;
the temperature is 190° C.

In the state of the art reached by the invention, the resolution is limited only by the masks defining the irradiated and non-irradiated areas.

The resolution is therefore of the order of 0.2 μm. A reaction rate of some 160 nm/sec. has been observed in the non-irradiated areas, as against 70 nm/sec in the irradiated ones.

In this invention, therefore, the reaction rate in the non-irradiated areas is twice that in the others. The residual thickness in these areas is about 75% of the initial thickness, taking account of the shrinkage after post-heating, improving all the qualities of the resin, i.e. sensitivity, resolution, etc.

Moreover, the PTCPhMA used in this embodiment is particularly resistant to the action of the $CF_4+O_2$ plasma, for which the action rate is about 4.4 nm/min at ambient temperature. This plasma may be used to engrave the semiconductor substrate through apertures made in the resin by the oxygen plasma engraving system already described.

What is claimed is:

1. A high resolution, plasma developable, photosensitive composition comprising a photosensitively effective amount of a photosensitive aromatic azide and a polymer selected from the group consisting of poly2,4,6-trichlorophenyl methacrylates and acrylates of the formula

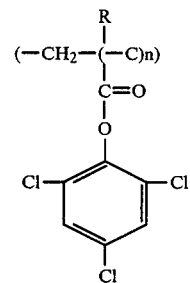

where R is H or CH$_3$, copolymers thereof with methyl methacrylate and copolymers thereof with methyl acrylate.

2. A composition as claimed in claim 1, characterized in that the polymer is poly(2,4,6-trichlorophenyl methacrylate) (PTCPhMA) of the formula:

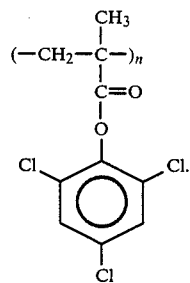

3. A composition as claimed in claim 1, characterized in that the polymer is poly(2,4,6-trichlorophenyl acrylate) (PTCPhA) of the formula:

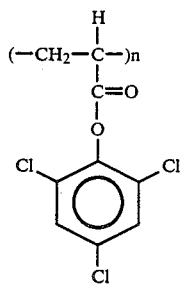

4. A composition as claimed in claim 1, characterized in that the polymer is selected from among:
poly(2,4,6-trichlorophenyl methacrylate-co-methyl methacrylate) and
poly(2,4,6-trichlorophenyl methacrylate-co-methyl acrylate) and
poly(2,4,6-trichlorophenyl acrylate-co-methyl methacrylate) and
poly(2,4,6-trichlorphenyl acrylate-co-methyl acrylate) and the related copolymers obtained from mono, di or trichloro derivatives.

5. A composition as claimed in claim 1, characterized in that the photosensitive compound is selected from along the aromatic azides of the formulae:

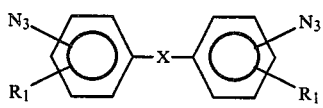

or:

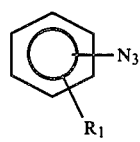

or:

or:

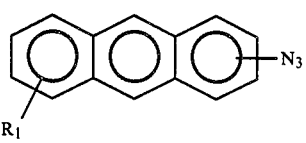

or:

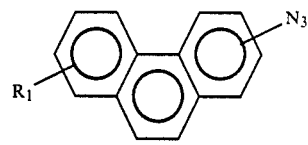

or:

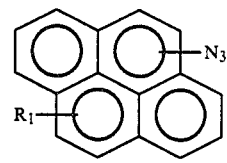

or:

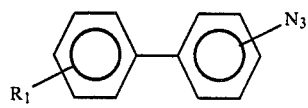

or:

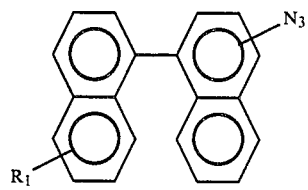

or:

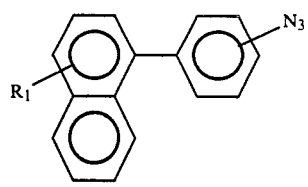

where X represents: —O—, —NH—, —CO—, —CH$_2$—, —S—, —SO$_2$—, —CH=CH—, —CH=CH—CO—CH=CH—, —CH=CH—CO, or

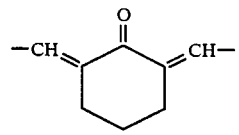

or

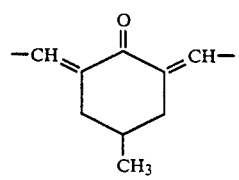

and where: R$_1$ represents: a hydrogen atom, a halogen atom, an azide group, an alkyl group or an alkyl halogen group.

* * * * *